(12) United States Patent
Bhat et al.

(10) Patent No.: US 7,643,099 B2
(45) Date of Patent: Jan. 5, 2010

(54) TELEVISION SYSTEM WITH CONTROLLED TUNING

(75) Inventors: Janardhana Bhat, Singapore (SG); Akbar Hassan Syed, Singapore (SG); Teck Tem Leong, Singapore (SG)

(73) Assignee: Koninklijke Philips Electronics N.V., Eindhoven (NL)

( * ) Notice: Subject to any disclaimer, the term of this patent is extended or adjusted under 35 U.S.C. 154(b) by 544 days.

(21) Appl. No.: 10/530,305

(22) PCT Filed: Sep. 18, 2003

(86) PCT No.: PCT/IB03/04154

§ 371 (c)(1),
(2), (4) Date: Apr. 4, 2005

(87) PCT Pub. No.: WO2004/032322

PCT Pub. Date: Apr. 15, 2004

(65) Prior Publication Data

US 2007/0070255 A1 Mar. 29, 2007

(30) Foreign Application Priority Data

Oct. 7, 2002 (SG) ................ PCT/SG02/00241

(51) Int. Cl.
*H04N 5/50* (2006.01)
*H04B 1/18* (2006.01)
(52) U.S. Cl. ............ 348/732; 348/731; 455/180.3
(58) Field of Classification Search ........... 348/732, 348/731; 455/180.3
See application file for complete search history.

(56) References Cited

U.S. PATENT DOCUMENTS

| 4,146,843 | A | * | 3/1979 | Isobe ................. 329/360 |
| 4,280,140 | A | * | 7/1981 | Skerlos ............... 348/735 |
| 4,302,778 | A | * | 11/1981 | Tanaka ............... 348/735 |
| 4,367,558 | A | * | 1/1983 | Gercekci et al. ..... 455/164.2 |
| 4,385,315 | A | * | 5/1983 | George et al. ........ 348/731 |
| 4,405,947 | A | * | 9/1983 | Tults et al. .......... 348/732 |
| 4,498,191 | A | * | 2/1985 | Rogers .............. 455/164.2 |
| 4,763,195 | A |   | 8/1988 | Tults |
| 5,157,492 | A | * | 10/1992 | Tults ................. 348/526 |
| 5,739,874 | A | * | 4/1998 | Badger et al. ........ 348/731 |

(Continued)

FOREIGN PATENT DOCUMENTS

JP        4229779 A    8/1992

(Continued)

*Primary Examiner*—Brian P Yenke

(57) ABSTRACT

Television systems comprising tuners (1), controllers (2) for controlling tuners (1), and stages (3) for receiving tuned signals from tuners (1) and for supplying control signals to controllers (2), use time-consuming automatic fine tuning signals while high speed tuning. By using lock signals (53) from phase-locked-loops (31) in stages (3) as control signals, an indication whether a channel is active or not can now be got much quicker due to lock signals being much faster available than automatic fine tuning signals. By using synchronization signals (54) from synchronization generators (4) as further control signals, a further indication is got. In a fast tuning mode, frequencies nearby active channels are detected, and in a fine tuning mode, channel frequencies are identified. According to the basic idea, lock signals originating from phase-locked-loops (31) in stages (3) can give first indications whether a channel is active or not, preferably and further advantageously in combination with second indications based upon synchronization signals (54).

8 Claims, 2 Drawing Sheets

U.S. PATENT DOCUMENTS

Figure 1:
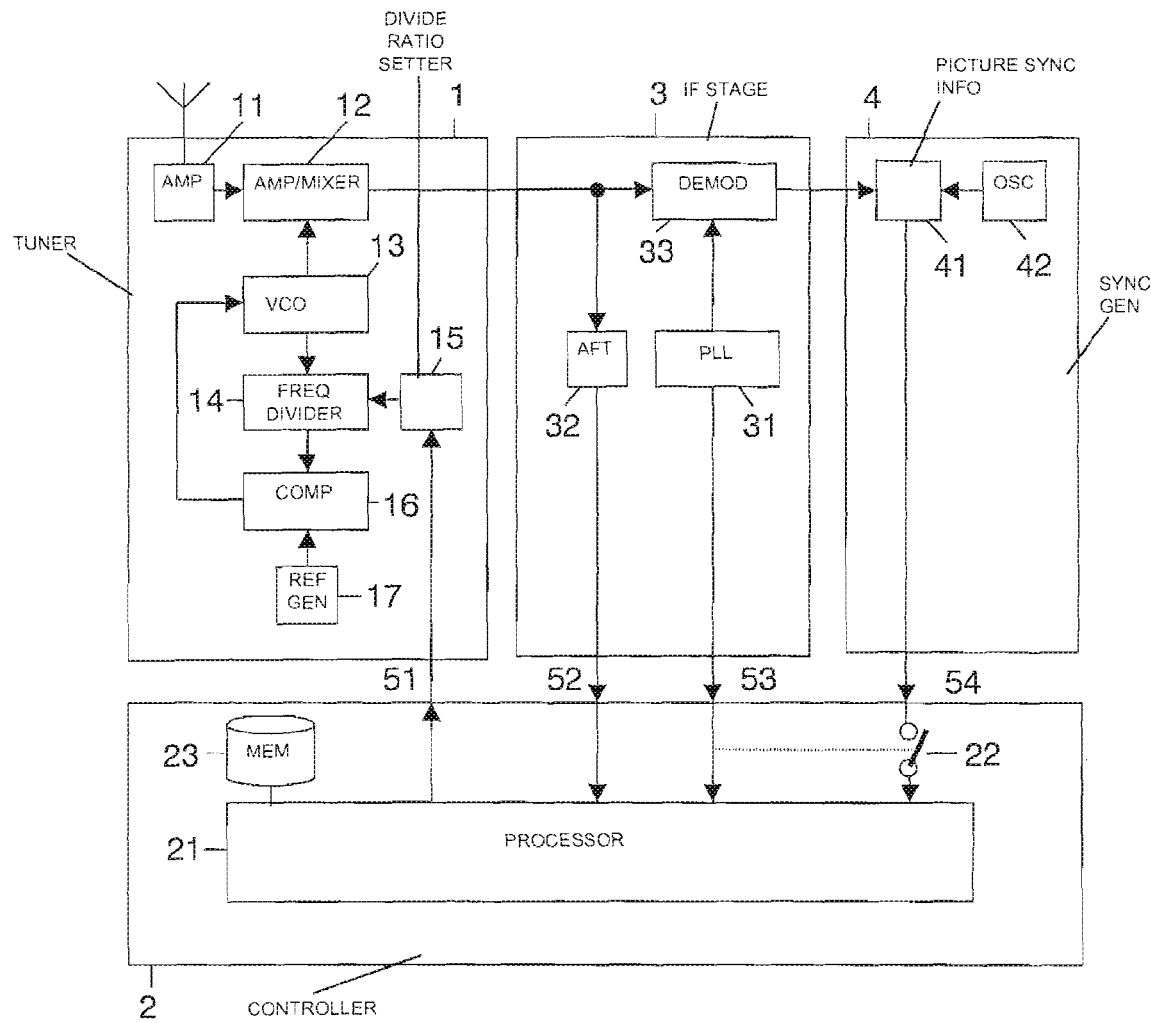

| | | | |
|---|---|---|---|
| 6,396,354 B1 * | 5/2002 | Murayama et al. | 331/17 |
| 6,597,408 B1 * | 7/2003 | Oak et al. | 348/731 |
| 6,724,440 B1 * | 4/2004 | Suan et al. | 348/731 |
| 7,113,230 B1 * | 9/2006 | Genovese et al. | 348/731 |

FOREIGN PATENT DOCUMENTS

| | | |
|---|---|---|
| JP | 5336458 A | 12/1993 |
| JP | 2000349848 | 12/2000 |

* cited by examiner

TELEVISION SYSTEM WITH CONTROLLED TUNING

The invention relates to a television system comprising a tuner for tuning video signals, a controller for controlling said tuner, and a stage for receiving tuned signals from said tuner and for supplying at least one control signal to said controller.

The invention also relates to a controller, a method and a processor program product for use in a television system.

A prior art system is known from U.S. Pat. No. 4,763,195, which discloses a television system comprising a tuner for tuning RF (radio frequency) signals (video signals), and a microprocessor (controller) for controlling said tuner, and an IF (intermediate frequency) stage for receiving tuned signals from said tuner and for supplying an automatic fine tuning signal (at least one control signal) to said microprocessor (controller). A first search for identifying active channels is limited to only predictable non-standard frequencies associated with major cable distribution networks, and a second search for identifying active channels includes more search frequencies and extends over a wider frequency range. During an auto-programming mode, only the first search is conducted to minimize time.

The known television system is disadvantageous, inter alia, due to requiring too much time for detecting an active channel: the automatic fine tuning signal is a time-consuming signal due to including detections of humps (U.S. Pat. No. 4,763,195-col. 8).

It is an object of the invention, inter alia, to get more quickly a first indication whether a channel is active or not (at a tuned frequency). The invention is defined by the independent claims. The dependent claims define advantageous embodiments.

The television system according to the invention comprises a tuner for tuning video signals, and a controller for controlling said tuner, and a stage for receiving tuned signals from said tuner and for supplying at least one control signal to said controller, wherein said stage comprises a phase-locked-loop, with said control signal comprising a lock signal originating from said phase-locked-loop.

By using the lock signal from the phase-locked-loop in said stage as the control signal, a first indication whether a channel is active or not (at a tuned frequency) can now be got much quicker due to said lock signal being much faster available than the automatic fine tuning signal. In case of said lock signal having a confining value, an active channel may be present (at a tuned frequency); but in case of said lock signal having a denying (or non-confirming) value, an active channel will not be present (at a tuned frequency).

It should be observed that, when controlling said tuner, said controller generates and supplies signals to said tuner for defining the operating frequencies for said tuner. This tuner usually also comprises a phase-locked-loop, but this tuner-phase-locked-loop is just for locking a tuner oscillator at said operating frequencies. Therefore, this tuner-phase-locked-loop is different from said phase-locked-loop in said stage located after said tuner and does not supply said lock signal to said controller. In fact, the oscillator in said tuner-phase-locked-loop is controlled by said controller.

A first embodiment of the television system according to the invention is defined by claim 2. By using the synchronization signal from said synchronization generator as a further control signal, a second indication whether a channel is active or not (at a tuned frequency) can now be got. Said controller comprises the switch for, in dependence of said lock signal, taking into account said synchronization signal (in case of said lock signal having a confirming value) or not (in case of said lock signal having a denying value). This synchronization signal is more time-consuming than said lock-signal. But due to the synchronization signal just being checked in case of existing doubts (said lock signal having a confirming value) about an active channel being present or not (at a tuned frequency) and not being checked in case of no doubts existing (said lock signal having a denying or non-confirming value), the television system can perform high speed tuning and detect active channels faster than prior art television systems.

A second embodiment of the television system according to the invention is defined by claim 3. By, in a fast tuning mode, controlling said tuner such that one or more frequencies nearby one or more active channels are detected, through getting first and possibly second indications, high speed tuning is performed, while in a fine tuning mode, one or more channel frequencies are identified.

A third embodiment of the television system according to the invention is defined by claim 4. By supplying said control signal further comprising the fine tuning signal to said controller, for example in said fine tuning mode, all active channels present can be identified.

A fourth embodiment of the television system according to the invention is defined by claim 5. By using the frequency table for predefining a number of channels, dependently upon the part of the world in which said television system is going to serve a television audience, this number of channels can be predefined. Said frequency table can be either a real table comprising all predefined frequencies or can be a starting predefined frequency together with one or more frequency steps (possibly per frequency band) to be taken for finding subsequent predefined frequencies.

A fifth embodiment of the television system according to the invention is defined by claim 6. By using the phase-locked-loop lock bit derived from an alternating current content of an oscillator input signal in said phase-locked-loop as said lock signal, a bit signal is used which usually is available via an integrated circuit output for said stage.

Embodiments of the controller according to the invention and of the method according to the invention and of the processor program product according to the invention correspond with the embodiments of the system according to the invention.

The invention is based upon an insight, inter alia, that fine tuning signals are time-consuming signals which are not strictly necessary for making high-speed tuning searches, and is based upon a basic idea, inter alia, that lock signals originating from phase-locked-loops in intermediate frequency stages can give a first indication whether a channel is active or not (at a tuned frequency).

The invention solves the problem, inter alia, of providing a television receiver which gets more quickly a first indication whether a channel is active or not (at a tuned frequency), and is advantageous, inter alia, in that this first indication forms a first foundation for high speed tuning and detecting active channels faster than prior art television systems, with said second indication forming a further advantageous second foundation for said high speed tuning.

These and other aspects of the invention will be apparent from and elucidated with reference to the embodiments(s) described hereinafter.

Figure 2:
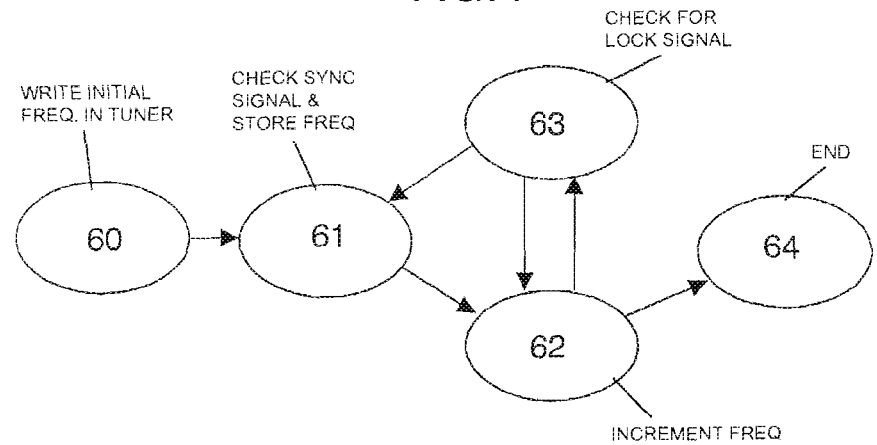
Figure 3:
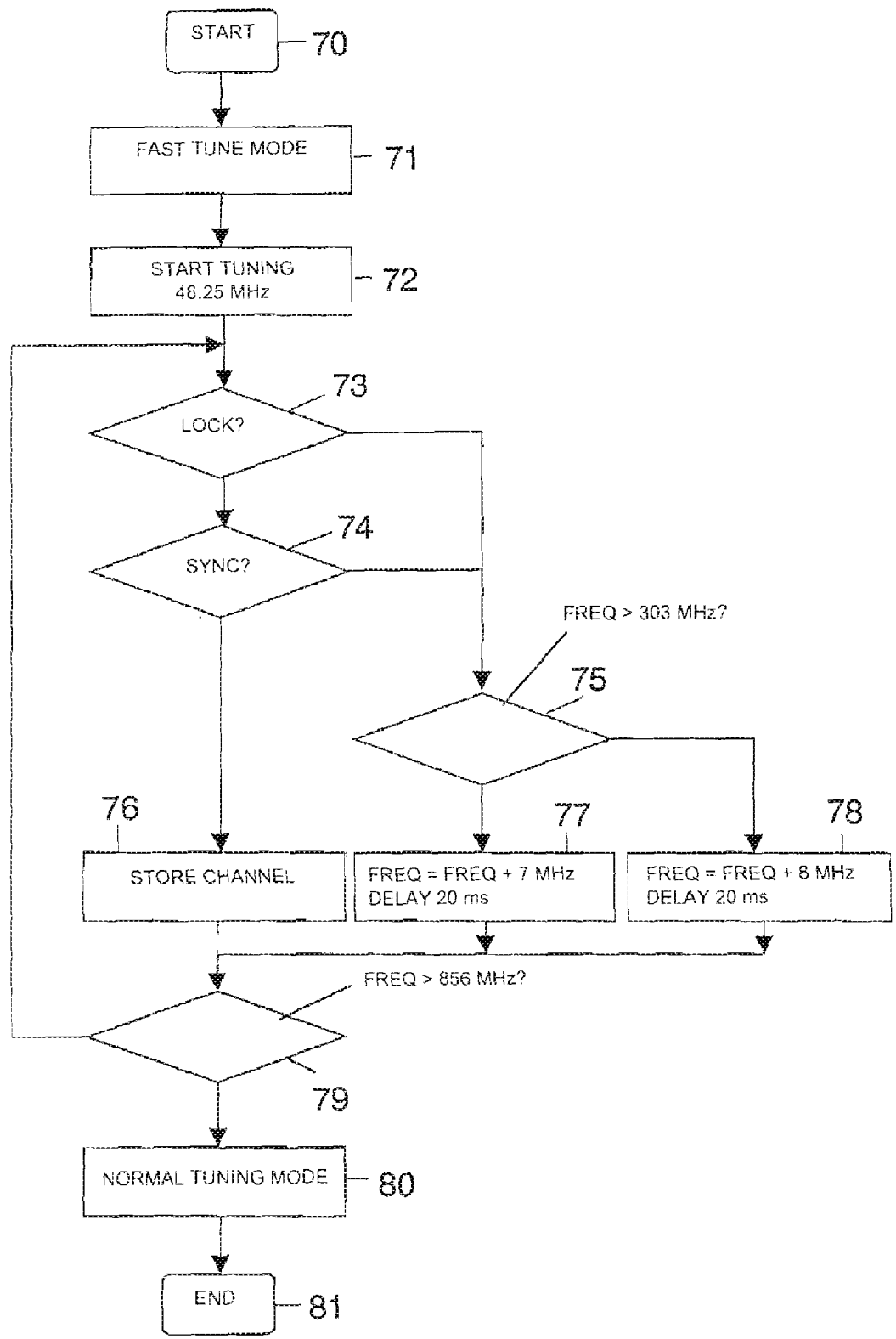

In the drawings,

FIG. 1 illustrates in block diagram form a television system according to the invention comprising a controller according to the invention, FIG. 2 illustrates in the form of a software stage machine a controller according to the invention, and FIG. 3 illustrates in flow chart form a method according to the invention and/or a processor program product according to the invention.

The television system according to the invention shown in FIG. 1 comprises a tuner 1 with an amplifier 11 coupled to an antenna for receiving and amplifying modulated video signals and to an amplifier/mixer 12 for amplifying and mixing signals originating from amplifier 11. Amplifier/mixer 12 is coupled to a voltage-controlled-oscillator (VCO) 13 for receiving a first oscillation signal from VCO 13 necessary for said mixing. VCO 13 is coupled to a frequency divider 14 controlled by a dividing ratio setting unit 15 for dividing a second oscillation signal from VCO 13 by a ratio defined by setting unit 15. A comparator 16 is located between said divider 14 and a reference generator 17 for comparing the divided second oscillation signal and a reference signal originating from generator 17. Comparator 16 is further coupled to VCO 13 for supplying a comparison signal to said VCO 13 for controlling purposes.

Amplifier/mixer 12 is further coupled to intermediate frequency stage 3 for supplying tuned signals to said stage 3, which comprises a demodulator 33 for demodulating said tuned signals and for supplying video signals to a synchronisation generator 4 and which comprises an automatic fine tuning unit 32 for receiving said tuned signals and for generating a fine tuning signal 52. Demodulator 33 is controlled by a phase-locked-loop 31 that generates a control signal comprising a lock signal 53. This lock signal 53 for example corresponds with a phase-locked-loop lock bit derived from an alternating current content of an oscillator input signal in said phase-locked-loop 31.

Synchronisation generator 4 comprises a picture synchronisation information block 41 for receiving said video signals from said demodulator 33 and for receiving an oscillation signal from a deflection oscillator 42. Block 41 generates a synchronisation signal 54.

Controller 2 comprises a processor 21 for receiving said lock signal 53, said fine tuning signal 52 and, via a switch 22, said synchronization signal 54, which switch 22 is controlled by said lock signal 53. Processor 21 is coupled to a memory 23 and generates a setting signal to be supplied to setting unit 15 for controlling tuner 1.

FIG. 2 illustrates in the form of a software stage machine a controller according to the invention. A first software stage 60 corresponds with the start of the software stage machine and with writing an initial frequency in tuner 1 (goto 61). A second software stage 61 checks for a synchronisation signal and if present stores the corresponding channel in a non-volatile memory (goto 62). A third software stage 62 increments the frequency by a factor (goto 64 if the highest frequency has been reached, otherwise goto 63). A fourth software stage 63 checks for a lock signal (goto 61 if present otherwise goto 62). A fifth software stage 64 corresponds with the end of the software stage machine.

The television system according to the invention as shown in FIG. 1 functions in view of FIG. 2 for example as follows.

In a fast tuning mode, tuner 1 is controlled by controller 2 such that such that one or more frequencies nearby one or more active channels are detected: by using for example a frequency table stored in memory 23 for predefining a number of channels, dependently upon the part of the world in which said television system is going to serve a television audience, this number of channels can be predefined. Said frequency table can be a starting predefined frequency together with one or more frequency steps (possibly per frequency band) to be taken for finding subsequent predefined frequencies, as shown by software stages 60 and 62. Or, alternatively, said frequency table may be a real table comprising all predefined frequencies.

The lock signal 53 from phase-locked-loop 31 in stage 3 is used as a control signal for controller 2, to get a first indication whether a channel is active or not (at a tuned frequency), as shown by software stage 63. In case of said lock signal 53 having a confirming value (goto software stage 61), an active channel may be present (at a tuned frequency); but in case of said lock signal 53 having a denying (or non-confirming) value (goto software stage 62), an active channel will not be present (at a tuned frequency).

The synchronization signal 54 from said synchronization generator 4 is used as a further control signal, to get a second indication whether a channel is active or not (at a tuned frequency), as shown by software stage 61. Controller 2 comprises switch 22 for, in dependence of said lock signal 53, taking into account said synchronization signal 54 (in case of said lock signal 53 having a confirming value) or not (in case of said lock signal 53 having a denying value). If the synchronisation signal 54 indicates synchronisation, the corresponding channel is stored in a non-volatile memory (like for example memory 22), as shown by software stage 61. Due to the time-consuming synchronization signal 54 just being checked in case of existing doubts about an active channel being present or not (at a tuned frequency) and not being checked in case of no doubts existing, the television system can perform high speed tuning and detect active channels faster than prior art television systems.

In a fine tuning mode, tuner 1 is controlled by controller 2 such that one or more channel frequencies are identified (thereby for example using said fine tuning signal 52).

About this fast tuning mode and fine tuning mode further the following. In case of a cable channel being slightly drifted from 175.25 MHz to 174.25 MHz, with 175.25 MHz for example being a standard cable channel, tuner 1 is controlled by controller 2 in such a way that tuner 1 is tuned to 175.25 MHz. Due to lock signal 53 still being available in case of the tuned frequency and the channel frequency being about two MHz away from each other, lock signal 53 in this case of one MHz distance between the tuned frequency and the channel frequency will get a confirming value. In the fast tuning mode, this frequency 175.25 MHz is then finally stored. In the fine tuning mode, for example in case of the television audience selecting this particular channel to be watched, the exact channel frequency is found, in this case 174.25 MHz.

In FIG. 3 illustrating in flow chart form a method according to the invention and/or a processor program product according to the invention, the blocks have the following meaning:

Block 70: Start, goto 71.
Block 71: High speed (or fast) tuning mode, goto 72.
Block 72: Start tuning at 48.25 MHz, goto 73.
Block 73: Has lock signal 53 a confirming value? If yes goto 74, if no goto 75.
Block 74: Has sync signal 54 a confirming value? If yes goto 76, if no goto 75.
Block 75: Is the tuning frequency >303 MHz? If yes goto 78, if no goto 77.
Block 76: Store the channel, goto 79.
Block 77: Add 7 MHz to the tuning frequency and a delay of 20 ms, goto 79.
Block 78: Add 8 MHz to the tuning frequency and a delay of 20 ms, goto 79.
Block 79: Is the tuning frequency >856 MHz? If yes goto 80, if no goto 73.
Block 80: Normal (or fine) tuning mode, goto 81.
Block 81: End.

The flow chart shown in FIG. 3 is an example for the Asia Pacific Region. Each (part of each) block 70-81 and each transition between each two block 70-81 can be a (further) (sub)step for a method according to the invention and/or a (further) (sub)function for a processor program product according to the invention. Said delays are introduced to give the phase-locked-loop 31 in stage 3 and phase-locked-loop 13, 14, 16, 17 in tuner 1 time to stabilize.

Phase-locked-loop 31 can for example be implemented according to phase-locked-loop 13, 14, 16, 17. Further units/blocks in tuner 1, stage 3, synchronization generator 4 and controller 2 are not to be excluded, like for example in general registers, buffers, filters etc. and more specifically a phase-1-loop with a phase-1-comparator and a horizontal oscillator in synchronization generator 4 etc.

Switch 22 is just an example of a possible way to take into account said synchronization signal 54 dependently upon a value of lock signal 53, other ways are not to be excluded, like gates, latches, switching buffers/amplifiers etc. Of course, usually switch 22 will be (functionally) integrated into processor 21.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements, and by means of a suitably programmed computer. In the device claim enumerating several means, several of these means can be embodied by one and the same item of hardware. The mere fact that certain measures are recited in mutually different dependent claims does not indicate that a combination of these measures cannot be used to advantage.

The expression "for" in for example "for tuning" and "for controlling" and "for synchronizing" and "for receiving" does not exclude that other functions are performed as well, simultaneously or not. The expressions "X coupled to Y" and "a coupling between X and Y" and "coupling/couples X and Y" etc. do not exclude that an element Z is in between X and Y. The expressions "P comprises Q" and "P comprising Q" etc. do not exclude that an element R is comprised/included as well. The terms "a" and "an" do not exclude the possible presence of one or more pluralities.

A preferred embodiment of the invention can be summarized as follows. Television systems comprising tuners (1), controllers (2) for controlling tuners (1), and stages (3) for receiving tuned signals from tuners (1) and for supplying control signals to controllers (2), use time-consuming automatic fine tuning signals while high speed tuning. By using lock signals (53) from phase-locked-loops (31) in stages (3) as control signals, an indication whether a channel is active or not can now be got much quicker due to lock signals being much faster available than automatic fine tuning signals. By using synchronization signals (54) from synchronization generators (4) as further control signals, a further indication is got. In a fast tuning mode, frequencies nearby active channels are detected, and in a fine tuning mode, channel frequencies are identified. According to the basic idea, lock signals originating from phase-locked-loops (31) in stages (3) can give first indications whether a channel is active or not, preferably and further advantageously in combination with second indications based upon synchronization signals (54).

The invention claimed is:

1. A television system comprising a tuner for tuning video signals, a controller for controlling said tuner, and a stage for receiving tuned signals from said tuner and for supplying at least one control signal to said controller, wherein said stage comprises an automatic fine tuning unit for generating an automatic fine tuning signal and a phase-locked-loop for generating a lock signal more quickly available than the automatic fine tuning signal, said lock signal forming said at least one control signal for said controller to provide an indication whether a channel at a tuned frequency is active or not, wherein said television system comprises a synchronization generator for synchronizing video signals originating from said stage and for supplying at least one synchronization signal to said controller, said controller comprising a switch for, in dependence of said lock signal, taking or not taking into account said synchronization signal.

2. The television system as claimed in claim 1, wherein said controller, in a fast tuning mode, controls said tuner such that one or more frequencies nearby one or more active channels are detected, with said controller, in a fine tuning mode, controlling said tuner such that one or more channel frequencies are identified.

3. The television system as claimed in claim 2, wherein said controller receives a further control signal, and wherein said stage comprises an intermediate frequency stage having means for generating a fine tuning signal, said automatic fine tuning signal comprising said further control signal.

4. The television system as claimed in claim 3, wherein a number of channels are predefined channels in accordance with a frequency table.

5. The television system as claimed in claim 4, wherein said lock signal is a phase-locked-loop lock bit derived from an alternating current content of an oscillator input signal in said phase-locked-loop.

6. A controller for use in television system comprising a tuner for tuning video signals and said controller for controlling said tuner and a stage for receiving tuned signals from said tuner and for supplying at least one control signal to said controller, wherein said stage comprises an automatic fine tuning unit for generating an automatic fine tuning signal and a phase-locked-loop for generating a lock signal more quickly available than the automatic fine tuning signal, said lock signal forming said at least one control signal for said controller to provide an indication whether a channel at a tuned frequency is active or not, wherein said television system comprises a synchronization generator for synchronizing video signals originating from said stage and for supplying at least one synchronization signal to said controller, said controller comprising a switch for, in dependence of said lock signal, taking or not taking into account said synchronization signal.

7. A method for use in television system comprising a tuner for tuning video signals and a stage for receiving tuned signals from said tuner, said method comprising the steps of:

tuning said tuner to one of a plurality of frequencies at which video signal should be located:

determining whether a channel is active at the tuned frequency using a phase-locked-loop in said stage, said phase-locked loop generating a lock signal in response thereto in a manner more quickly available that an automatic fine tuning signal of an automatic fine tuning unit of the stage; and controlling the tuner with a control signal comprising said lock signal,
wherein said method further comprises the step of:
synchronizing video signals originating from said stage and for supplying at least one synchronization signal,
and wherein said controlling step takes or does not take into account said synchronization signal, in dependence on said lock signal.

8. A computer-readable medium for use in television system comprising a tuner for tuning video signals, a stage for receiving tuned signals from said tuner and a controller, which said computer-readable medium having programming instructions stored thereon for causing the controller to execute the method as claimed in claim 7.

* * * * *